Oct. 4, 1960 C. F. WHEATLEY, JR 2,955,258

SEMI-CONDUCTOR SIGNAL AMPLIFIER CIRCUIT

Filed Dec. 17, 1957

INVENTOR.
CARL F. WHEATLEY, JR

BY [signature]

ATTORNEY

United States Patent Office 2,955,258

Patented Oct. 4, 1960

2,955,258

SEMI-CONDUCTOR SIGNAL AMPLIFIER CIRCUIT

Carl F. Wheatley, Jr., South Bound Brook, N.J., assignor to Radio Corporation of America, a corporation of Delaware Filed Dec. 17, 1957, Ser. No. 703,435

3 Claims. (Cl. 330—13)

Figure 1:
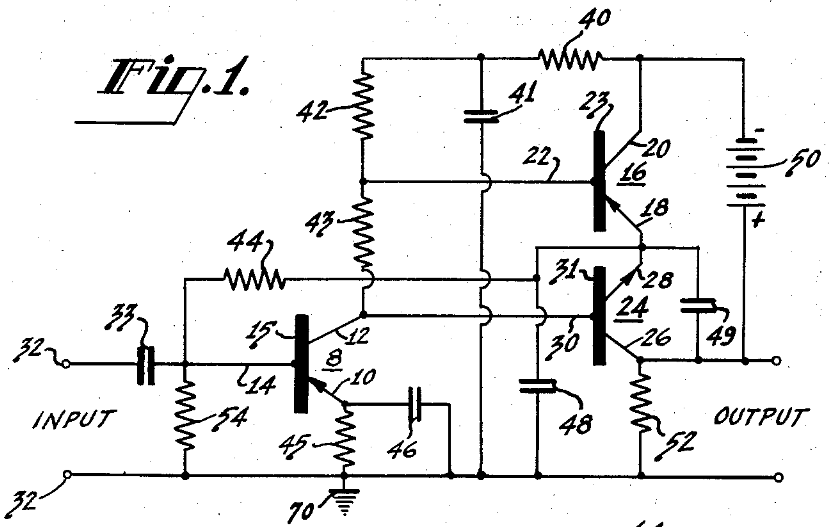

This invention relates to signal amplifier circuits which include an output stage having two signal paths arranged for push-pull operation and in particular to signal amplifier circuits of that type wherein transistors provide the active signal amplifying elements.

It is well known that transistors of P-type conductivity have symmetrical conduction characteristics when compared with transistors of N-type conductivity. Thus N-P-N and P-N-P type junction transistors are referred to as being opposite conductivity or complementary symmetry types. The symmetrical properties of transistors, as referred to above, can be used for many different applications. For example, as the base current is changed in the same direction in an N-P-N and a P-N-P transistor respectively, the flow of emitter-collector current will increase in one transistor and decrease in the other transistor. Accordingly, if properly biased and connected in a signal amplifier, for example, a pair of opposite conductivity transistors will provide transition from single-ended to double-ended or push-pull output. Generally, for such purpose, the transistors may be connected in parallel. When so connected, like input electrodes of the two transistors are connected for signal conduction or amplification to the same input terminals of the amplifier, and like output electrodes of the two transistors are connected to the same output terminals of the amplifier.

The circuit connections for complementary symmetry push-pull amplifiers may be made in several different specific ways depending on the application and particular operating characteristics desired. One way of connecting such an amplifier is to couple the signal input circuit with the base electrodes in parallel, with one side of the input circuit connected with ground for the amplifier. The emitter electrodes of such push-pull transistors are coupled for signal current flow to the amplified ground. The collector electrodes are connected with a bias voltage source such as a battery to provide proper bias of opposite polarity for said electrodes. A load device or utilization means is connected between one of the collectors and amplifier ground. Thus, the signal input circuit, the load device and the emitters are all returned to the common amplifier ground for signal current flow. Such a circuit configuration is referred to as a common-emitter complementary symmetry push-pull amplifier. With a common-emitter complementary symmetry push-pull amplifier circuit, embodying relatively simple circuit connections, a single-ended input signal may be applied to the input circuit and an amplified single-ended output signal may be taken from the load circuit. In addition this configuration provides both voltage and current gain. A push-pull circuit of this type may be directly driven from a low impedance source such as a common emitter transistor amplifier stage having a collector load resistance which has a relatively low value.

A limitation in known complementary symmetry amplifiers having a direct-coupled transistor driver stage has been an inability to drive the output transistors into saturation, thereby reducing the signal output voltage capabilities of the amplifier circuit. In an efficient amplifier circuit clipping of the signal should occur in the output stage at the same time that it occurs in the preceding amplifier stages, thereby fully utilizing the signal handling capacity of all stages in the amplifier. This limitation has occurred in prior art amplifiers of the common emitter type because the output electrode of the driver transistor stage has been required to handle a voltage variation equal to the sum of the output signal voltage and the driving signal voltage for the output transistors. The result is that the D.C. voltage on the driver output electrode has to be relatively large to handle this voltage variation, without clipping, and it also necessarily results in clipping in the driver transistor before it can occur in the output transistors.

It is accordingly an object of the present invention to provide an improved transistor signal amplifier comprising a push-pull complementary symmetry output stage and a driving stage wherein the output signal voltage is not limited by the driving stage.

It is yet another object of the present invention to provide an improved semi-conductor amplifying circuit of the push-pull type wherein transistors of opposite conductivity types are arranged to provide more effective utilization of signal energy.

These and further objects and advantages of the present invention are achieved, in general, by operating both the driver transistor stage and the push-pull complementary symmetry output stage in the common emitter mode and by preventing the signal voltage which is generated across the output load impedance from appearing at the output electrode of the driver transistor. This enables the driver transistor stage to be operated so it need only supply the small signal voltage necessary to drive the output transistors. Accordingly, the direct voltage at the driver transistor output electrode need be only large enough to supply this small signal voltage to the output transistors without clipping.

Figure 2:
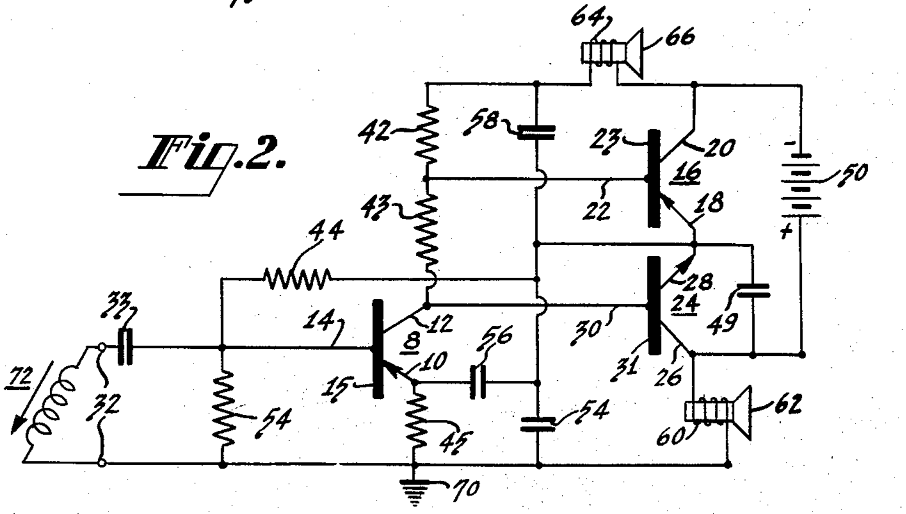

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a signal amplifying circuit having complementary-symmetry transistor output and direct coupled transistor driver stages, embodying the invention; and Figure 2 is a schematic circuit diagram of a phonograph amplifier with dual speaker output embodying the amplifying circuit of Figure 1 for effective utilization of the power output in accordance with the invention.

Referring now to the drawing, wherein like parts are indicated by like reference numerals, and particularly to Figure 1, the signal amplifying circuit may be considered to be the output stage of a signal receiver, for example, and comprises a first stage transistor amplifier or driver 8, and a pair of output stage push-pull transistors 16 and 24. Each of the transistors may be considered to be of the junction type having a semi-conductive body and three contacting electrodes. In the present example, the transistor 8 comprises a semi-conductive body 15 and three electrodes which are an emitter 10, a collector 12 and a base 14. Likewise, the push-pull output transistors 16 and 24 comprise semi-conductive bodies 23 and 31 respectively, and three electrodes each comprising emitters 18 and 28, collectors 20 and 26 and bases 22 and 30 respectively. As shown, the first stage amplifier or driver transistor 8 is of the P-N-P junction type. The transistor 16 of the push-pull output stage is of the P-N-P type. Consequently, the transistor 24 is of the N-P-N type. It should be understood that the specific conductivity of the transistors used is not critical so long as the biasing and conductivity between stages is correct.

Biasing potential for the common or emitter electrode 10 of the driver transistor 8 is obtained through a stabilizing resistor 45 connected between the emitter and ground. The output or collector electrode 12 is connected through three series resistors 43, 42 and 40 to the negative terminal of a biasing battery 50.

The resistor 45 is bypassed by a capacitor 46 to prevent signal degeneration. A capacitor 41, connected between ground 70 and the junction of the resistors 40 and 42, provides a bypass path to ground for signal voltage variations from the output circuit and also provides the collector 12 of the driver transistor 8 with a constant bias voltage. In addition, base bias for the driver transistor 8 is obtained through a resistor 54 connected from the base electrode 14 to ground and a second resistor 44 connected from the base 14 to both emitters 18 and 28 which, as indicated, are connected together in the complementary symmetry output stage. The resistor 44 provides a negative direct-current feedback path between the emitters of the output transistors and the base of the driver transistor, thus stabilizing the operating point of the circuit. A capacitor 48, which is connected between ground 70 and the common emitters 18 and 28 prevents signal feedback through the resistor 44 and provides additional advantages as will be discussed hereinafter. Also it may be noted that in the present example, the driver transistor 8 is biased for class A amplifying operation.

Input signals for the amplifier are applied between the base 14 and the point of reference potential or ground 70 through a suitable input circuit the terminals of which are indicated at 32. The input circuit of the present example includes a coupling capacitor 33 connected between one terminal and the base 14, the other terminal being connected to ground. Signal output current is derived from the collector 12 of the transistor 8 and is applied to the base 30 of the N-P-N transistor 24 through the direct connection indicated. Thus the driver transistor 8 is of the common emitter configuration, the emitter being common to the input and output circuits.

The base 22 of the other output transistor 16 is connected through the resistor 43 to the collector 12 of the driver transistor. Thus, the output current from the driver transistor flows through the resistor 43 and develops a small initial differential forward bias for the bases 30 and 22 of the respective push-pull transistors. The value of the resistor 43 is chosen, in any particular instance and for a given set of transistors to minimize cross-over distortion in the push-pull output stage over the operating temperature range, and at the same time to keep the static current in the push-pull transistors at a relatively small value. By substituting a temperature sensitive impedance means for the resistor 43, such as a thermistor, the temperature range over which the circuit will operate acceptably may be extended.

Consideration may now be given to the circuit for the push-pull output stage of the amplifier. It will be noted that the two emitters 18 and 28 of the output transistors are connected through a capacitor 48 to ground 70. Biasing voltages for the push-pull output transistors 16 and 24 are obtained by connecting the collector 20 of the transistor 16 directly with the negative terminal of the biasing battery 50 and the collector 26 of the transistor 24 directly with the positive terminal of the biasing battery 50 as shown. In addition, the base 30 of the N-P-N push-pull transistor 28 is connected through the resistors 40, 42 and 43 to the negative terminal of the biasing battery 50. As thus described, biasing for the push-pull output transistors 16 and 24 is seen to be proper for class B push-pull amplification action, although other classes of operation are possible. Furthermore, the biasing network comprises the resistors 40, 42 and 43, has a low impedance value which establishes a relatively stable operating point. In addition, the resistors 40, 42 and 43 provide a direct-current return path for the base current of the transistor 24. Output signals are derived across a load resistor 52 connected between the collector electrode 26 of the transistor 30 and ground. A capacitor 49 is connected between the collector 26 and the emitter 28 of the transistor 24 to provide high-frequency roll-off.

In operation, a signal applied to the input terminals 32 is conveyed through the capacitor 33 to the base electrode 14 of the driver transistor 8. This signal is amplified and appears at the collector 12 of the driver transistor 8. The resistor 43 connected in series with the collector 12 is normally of relatively low resistance value to provide a threshold bias for the class B output stage as hereinbefore described, while the resistor 42 is relatively high in value. Therefore, the amplified signal voltage at the collector 12 appears almost entirely across the resistor 42 and this signal is then applied to the base electrodes 22 and 30 of the output transistors 16 and 24 respectively. If it is assumed that a positive half cycle of signal voltage is applied to the driver transistor 8 through the input terminals 32, this signal will be amplified and phase inverted in the driver transistor. This amplified negative signal will then be applied to the base electrodes 22 and 30. The P-N-P transistor 16 will then begin to conduct heavily while the N-P-N transistor 24 will be non-conductive, and an amplified signal will appear across the load resistor 52. On negative excursions of the input signal, on the other hand, the N-P-N transistor will conduct and the other half of the input signal will be amplified and appear across the load resistor 52. Thus push-pull operation is provided.

Since the battery 50 is connected to the collector end of the load impedance represented by the resistor 52, signal voltage variations across this resistor appear in series with the battery voltage. Therefore, the collector voltage for the driver transistor consists of both the direct battery voltage and the superimposed output signal voltage. This voltage is applied to the collector 12 of the driver transistor 8 through the series connected resistors 40, 42, and 43. Since the voltage swing across the load resistor 52 is relatively large, a large signal voltage is also applied to the collector 12 of the driver transistor 8. The direct voltage at the collector 12 would have to be relatively large to accommodate this signal voltage. At the same time additional battery voltage would have to be available for supplying the necessary driving signal to the bases of the output transistors. Should the signal voltage variation across the load resistor 52 become equal to the battery supply voltage, and since this signal appears at the collector 12 of the driver transistor 8, it will be seen that a condition of operation could be reached when no battery voltage would be available for the transistor 8 to use for supplying a signal to the bases of the output transistors. Thus, in a direct-coupled transistor amplifier of this type, the output transistors cannot be driven into saturation when the output signal voltage appears at the collector or output electrode of the driver transistors.

In accordance with the invention such operation is prevented in the circuit of Figure 1. Signal voltage appearing across the output load resistor 52 that might be applied to the driver collector 12 is bypassed to ground by the capacitor 41. At the same time the resistor 40 prevents the capacitor 41 from bypassing the load impedance 52. Hence the maximum voltage swing at the collector of the driver transistor need only be sufficient to cause the output transistors to go into saturation. Since the complementary symmetry output stage is operated in the common-emitter mode, which provides voltage gain, the input signal voltage required can be low and on the order of a few tenths of a volt. This may be achieved by a direct collector-to-emitter voltage on the driver transistor which may be one volt for example. Furthermore, with this improved circuit, a low-cost driver transistor having low voltage rating may be used while at the same time high voltage transistors may, if required, be used in the output stage.

While it will be understood that the circuit specifications may vary according to the design for any particular application, the following circuit specifications are included for the circuit of Figure 1 by way of example only,

| | |
|---|---|
| Resistors 40, 42, 43, 44, 45, 52, 54 | 270; 1200; 150; 10,000; 470; 36 and 6,800 ohms respectively |
| Capacitors 41, 46, and 48 | 50 microfarads each |
| Battery 50 | 6 volts |
| Transistors 8 and 16 | Commercial type 2N109 |
| Transistor 24 | N-P-N transistor with characteristics similar to 2N109 |

With circuit components of these values, the amplifier circuit embodying the invention will provide a nominal 120 milliwatt output for a 25 millivolt signal across the input terminals.

Referring now to Figure 2, and the phonograph amplifier modification of the circuit of Figure 1, the input terminals 32 are connected with a phonograph pick-up head 72 which may be of the variable reluctance type for example. Sound output is produced by a loudspeaker 62 having a voice coil 60 connected between the collector 26 of the transistor 24 and ground 70 replacing the output resistor 52 of the circuit of Figure 1. To obtain maximum signal efficiency from the amplifier an additional loudspeaker 66 having a voice coil 64 may be connected between the collector 20 of transistor 16 and the junction of the resistor 42 and a capacitor 58 in place of the resistor 40 of the circuit of Figure 1. It is to be noted that in this modification of the circuit of Figure 1, the loudspeaker 66 is connected effectively in parallel with the loudspeaker 62 for signal voltages, through the battery 50 and two capacitors 58 and 54, connected in series between the voice coil 64 and ground 70. For improved sound quality, the loudspeakers 62 and 66 may be a "woofer" and "tweeter" combination respectively. By connecting the junction of the capacitors 54 and 58 and the common emitters 18 and 28 of the transistors 16 and 24 as shown, the emitters are thereby coupled to signal ground through the capacitor 54 thus providing common emitter operation for the output stage. Signal degeneration in the emitter of the driver stage is reduced by connecting a bypass capacitor 56 from the emitter 10 of the driver transistor 8 to the junction of the capacitors 54 and 58. The emitter resistor 45 is then bypassed to ground by the series combination of the capacitors 56 and 54. The remaining circuitry is identical to and operates generally the same as that described in Figure 1.

In the specific phonograph operation of the present circuit, the pick-up head 72 generates a signal voltage in accordance with audio information or modulation contained in the grooves of a phonograph record. This voltage is applied between the terminals 32, one of which is coupled with the base 14 of the transistor 8 through the capacitor 33 and the other of which is connected to ground 70. The signal voltage is amplified by the transistor 8, phase inverted, and directly applied to the bases 22 and 30 of the transistor 16 and 24. The transistor 24 conducts in response to the positive portion of the input signal voltage and the transistor 16 conducts in response to the negative portion of the input signal voltage, thereby providing an amplified push-pull output signal. A small forward bias for the output transistors is provided by the voltage drop in the resistor 43 due to the driver collector current flowing therein. The amplified output signal is developed both in the loudspeaker 62 and the loudspeaker 66 as hereinbefore has been pointed out are connected in parallel for signal voltages.

In accordance with the invention, the voice coil 64 of the loudspeaker 66 and the series combination of the capacitors 54 and 58 provide isolation between the collector circuit of the driver transistor and the output voltage appearing across the voice coil 60 of the loudspeaker 62. Signal voltage developed across the voice coil 60 which might normally appear in the collector circuit of the driver is bypassed to ground by the series combination of the capacitors 58 and 54, and the impedance presented by the voice coil 64 of the loudspeaker 66 prevents these capacitors from bypassing the loudspeaker 62. Thus the driver transistor is only required to supply the necessary signal voltage for driving the output transistors as hereinbefore described. It is to be noted that in this circuit, the driver transistor and the output transistors both operate in the common emitter mode. The capacitor 49 connected between the common emitters and the collector 26 of the transistor 24 as in the circuit of Figure 1, may here have a value to provide high frequency roll-off as may be desirable for phonograph sound reproduction. Stabilization for this circuit, as in the prior circuit, is provided by the feedback resistor 44 between the common emitters 18 and 28 of the transistors 16 and 24 and the base electrode 14 of the driver transistor 8. The effect of this resistor on the circuit stability is as described heretofore.

As described, a circuit embodying the invention permits the development of an output peak-to-peak voltage which may equal the battery supply voltage. Furthermore, this may be achieved in a direct-coupled complementary-symmetry transistor circuit which is not driver limited and which requires a relatively small driver output voltage to saturate the output transistors. A signal amplifier circuit of the type described, embodying the invention, provides stable as well as highly efficient operation insuring full realization of the maximum voltage capabilities of the circuit.

What is claimed is:

1. A signal amplifier circuit comprising in combination, a push-pull output stage including a first and second transistor of opposite conductivity types each including base, emitter and collector electrodes, a driving stage including a driver transistor having input, output and common electrodes, means direct current conductively coupling the output electrode of said driver transistor with the base electrodes of said first and second transistors for applying driving signals thereto, means connecting the common electrode of said driver transistor with a point of reference potential for said amplifier, means for deriving a push-pull output signal from said amplifier circuit in response to said driving signals including bias supply means having first and second terminals, means connecting the collector to emitter current paths of said first and second transistors in series between the first and second terminals of said bias supply means so that like electrodes of said first and second transistors are connected together, an output circuit including a load impedance element connected between said first terminal of said bias supply means and a point of reference potential, a direct current conductive impedance element connected between the second terminal of said bias supply means and said driver transistor for providing a bias voltage for said driver transistor and for isolating said driver transistor from the output circuit of said first and second transistors, and means providing a low impedance signal path from a point connected to said direct current conductive impedance element remote from said second terminal to said point of reference potential.

2. A signal amplifier circuit comprising in combination, a push-pull output stage including a first and second transistor of opposite conductivity types each including base, emitter and collector electrodes, a driving stage including a driver transistor having input, output and common electrodes, means direct current conductively coupling the output electrode of said driver transistor with the base electrodes of said first and second transistors for applying driving signals thereto, means connecting the common electrode of said driver transistor with a point of reference potential for said amplifier, direct current conductive means connecting together the emitter electrodes of said first and second transistors, capacitive means providing a low impedance signal path from said emitter electrodes to said point of reference potential, means for deriving a push-pull output signal from said amplifier circuit in response to said driving signals including bias supply means having first and second terminals, means connecting the collector to emitter current paths of said first and second transistors in series between the first and second terminals of said bias supply means, an output circuit including a load impedance element connected between said first terminal of said bias supply means and a point of reference potential, first and second direct current conductive impedance elements connected in series between the second terminal of said bias supply means and said driver transistor for providing a bias voltage for said driver transistor and for isolating said driver transistor from the output circuit of said first and second transistors, and means providing a low impedance signal path from the junction of said first and second impedance elements to said point of reference potential.

3. A signal amplifier circuit comprising in combination, a push-pull output stage including a first and second transistor of opposite conductivity types each including base, emitter and collector electrodes, a driving stage including a driver transistor of the same conductivity type as said first transistor and having base, emitter and collector electrodes, means directly connecting the collector electrode of said driver transistor with the base electrode of said second transistor for applying driving signals thereto, a resistor directly connected between the collector electrode of said driver transistor and the base of said first transistor for applying driving signals thereto, means connecting the emitter electrode of said driver transistor with a point of reference potential for said amplifier, means directly connecting together the emitter electrodes of said first and second transistors, a capacitor connecting said emitter electrodes to a point of reference potential, means for deriving a push-pull output signal from said amplifier circuit in response to said driving signals including bias supply means directly connected between the collector electrodes of said first and second transistors for connecting the collector to emitter current paths of said first and second transistors and said bias supply means in series, an output circuit including a load impedance device connected between the collector of said second transistor and a point of reference potential, a second and third resistor connected in series between the collector and base of said first transistor, said second resistor providing the predominant load impedance for said driver transistor and said third resistor serving to isolate the collector of said driver transistor from the output circuit of said first and second transistors, and a capacitor for providing a low impedance signal path connected from the junction of said second and third resistors to said point of reference potential.

References Cited in the file of this patent

UNITED STATES PATENTS

| | | |
|---|---|---|
| 2,762,870 | Sziklai et al. | Sept. 11, 1956 |
| 2,810,024 | Stanley | Oct. 15, 1957 |